US010001161B2

(12) United States Patent
Riaf

(10) Patent No.: US 10,001,161 B2
(45) Date of Patent: Jun. 19, 2018

(54) ROTARY FLEX UNION

(71) Applicant: Varian Semiconductor Equipment Associates, Inc., Gloucester, MA (US)

(72) Inventor: Arthur P. Riaf, Gloucester, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 148 days.

(21) Appl. No.: 15/165,051

(22) Filed: May 26, 2016

(65) Prior Publication Data

US 2016/0265583 A1 Sep. 15, 2016

Related U.S. Application Data

(63) Continuation of application No. 13/799,089, filed on Mar. 13, 2013, now Pat. No. 9,377,048.

(51) Int. Cl.

*F16C 11/04* (2006.01)
*H01J 37/20* (2006.01)
*H01J 37/317* (2006.01)

(52) U.S. Cl.

CPC .............. *F16C 11/04* (2013.01); *H01J 37/20* (2013.01); *H01J 37/3171* (2013.01); *H01J 2237/002* (2013.01); *H01J 2237/2001* (2013.01); *Y10T 403/25* (2015.01)

(58) Field of Classification Search

CPC ......... F16C 11/04; H01J 37/317; H01J 37/20; H01J 37/3171; H01L 21/265
See application file for complete search history.

(56) References Cited

U.S. PATENT DOCUMENTS 5,473,627 A 12/1995 Tsujimoto et al.
6,794,664 B1 9/2004 Mitchell et al.
2008/0124903 A1 5/2008 England et al.
2012/0241648 A1 9/2012 Krampert

*Primary Examiner* — Daniel J Wiley

(57) ABSTRACT

A rotary union is disclosed for use in semiconductor processing applications. The rotary is coupled between a platen base and a platen of a rotating platen assembly. The rotary union includes a coiled flexible tube member for passing a flow of cryogenic fluid to the platen for cooling during an ion implant procedure. The coiled flexible tube member has a first configuration associated with a non-rotated position of the platen and a second configuration associated with a rotated position of the platen. In the first configuration the coiled flexible tube member has a first bend radius, and in the second configuration the coiled flexible tube member has a second bend radius that is smaller than first bend radius. The rotary union also includes a base with a peripheral wall that restricts movement of the coiled flexible tube member as it cycles between the first and second configurations.

17 Claims, 12 Drawing Sheets

300 302 318 308 314 309 320 310 336 338 312 334 316 328 330 306 311 314 304

ROTARY FLEX UNION

RELATED APPLICATIONS

This application is a continuation of co-pending U.S. patent application Ser. No. 13/799,089 filed Mar. 13, 2013, the entirety of which application is incorporated by reference herein.

FIELD

Embodiments of the invention relate to rotary unions in general, and in particular to a cryogenic rotary union utilizing flexible tubing for use in semiconductor processing applications.

DISCUSSION OF RELATED ART

Ion implantation is a process of depositing chemical species into a substrate by bombardment of the substrate with energized ions. In semiconductor manufacturing, ion implanters are used for doping processes that alter the type and level of conductivity of target materials. A precise doping profile in an integrated circuit (IC) substrate and its thin-film structure is important for proper IC performance. To achieve a desired doping profile, one or more ion species may be implanted in different doses and at different energy levels.

FIG. 1 depicts an ion implanter system. The ion implanter 100 includes a power source 101, an ion source 102, extraction electrodes 104, a 90° magnet analyzer 106, a first deceleration (D1) stage 108, a 70° magnet analyzer 110, and a second deceleration (D2) stage 112. The D1 and D2 deceleration stages (often referred to as "deceleration lenses") are each comprised of multiple electrodes with a defined aperture to allow an ion beam to pass therethrough. By applying different combinations of voltage potentials to the multiple electrodes, the D1 and D2 deceleration lenses may manipulate ion energies and cause the ion beam to hit a target workpiece 114 at a desired energy. A number of measurement devices 116 (e.g., a dose control Faraday cup, a traveling Faraday cup, or a setup Faraday cup) may be used to monitor and control the ion beam conditions. Although not shown in FIG. 1, the target workpiece 114 may be supported by a platen which can be used to fix and to move the workpiece during implantation.

It has been discovered that for silicon wafer workpieces, a relatively low temperature during ion implantation is advantageous for amorphization of the silicon wafer. For example, performing ion implantation at temperatures below −60° C. may substantially improve ion implantation process performance. In ion implantation applications, wafers are typically cooled during the implantation process by a cryogenic liquid supplied to a cooling platen, where the cryogenic liquid has been cooled by a chiller.

In addition to cooling, it may be desirable to manipulate the position of the wafer during ion implantation. For example, a rotating platen may be used to clamp the wafer during implant and provide wafer cooling. The rotating platen may allow horizontal and vertical wafer tilt to align the wafer to the ion beam in a desired manner. By allowing the platen to rotate the wafer between passes through the ion beam during implant, the effect of minor beam non-uniformities can be reduced.

One problem with such arrangements is that the cooling fluid, often at cryogenic temperature, must be supplied to the rotating platen. Existing rotary unions, used to couple cryogenic supply tubing to the rotating platen, have proved unsuitable for long term use under such low temperature conditions, and over a large number of cycles. As can be appreciated, leakage of cryogenic fluid is highly undesirable, and thus, there is a need for an improved arrangement for coupling a cryogenic fluid supply to a rotating platen.

SUMMARY OF THE INVENTION

This Summary is provided to introduce a selection of concepts in a simplified form that are further described below in the Description of Embodiments. This Summary is not intended to identify key features or essential features of the claimed subject matter, nor is it intended as an aid in determining the scope of the claimed subject matter.

A rotary platen apparatus is disclosed. The apparatus may include a platen base, a platen rotatably coupled to the platen base, and a rotary union for supplying cryogenic fluid to cool the platen. The rotary union may be coupled between the platen base and the platen, and may include a coiled flexible tube member. The coiled flexible tube member may have a first configuration associated with a non-rotated position of the platen and a second configuration associated with a rotated position of the platen. In the first configuration the coiled flexible tube member may have a first bend radius, and in the second configuration the coiled flexible tube member may have a second bend radius. The first and second bend radii may be different.

A rotary flex union is disclosed for use in semiconductor processing. The union may include a base portion, a stem rotatably coupled to the base portion, a drive block portion connected at a first end to the stem and at the second end to a first tube fitting, and a coiled flexible tube member having first and second ends, the first end coupled to the drive block portion, and the second end coupled to a second tube fitting. The coiled flexible tube member may have a first configuration associated with a non-rotated position of the union and a second configuration associated with a rotated position of the union. In the first configuration the coiled flexible tube member may have a first bend radius, and in the second configuration the coiled flexible tube member may have a second bend radius. The first and second bend radii may be different.

A rotary platen apparatus is disclosed. The apparatus may include a platen base having a platen rotatably coupled thereto, and a rotary union for supplying cryogenic fluid from a fluid source to cool the platen. The rotary union may be coupled between the platen base and the platen. The rotary union may include a coiled flexible tube member having a first configuration associated with a non-rotated position of the platen and a second configuration associated with a rotated position of the platen. In the first configuration the coiled flexible tube member may have a first bend radius, and in the second configuration the coiled flexible tube member may have a second bend radius that is smaller than the first bend radius.

BRIEF DESCRIPTION OF THE DRAWINGS

The accompanying drawings illustrate preferred embodiments of the disclosed method so far devised for the practical application of the principles thereof, and in which.

DESCRIPTION OF EMBODIMENTS

The disclosed rotary union will now be described more fully hereinafter with reference to the accompanying drawings, in which embodiments of the disclosure are shown. The disclosed rotary union, however, may be embodied in many different forms and should not be construed as limited to the explicitly recited embodiments set forth herein.

Figure 1:
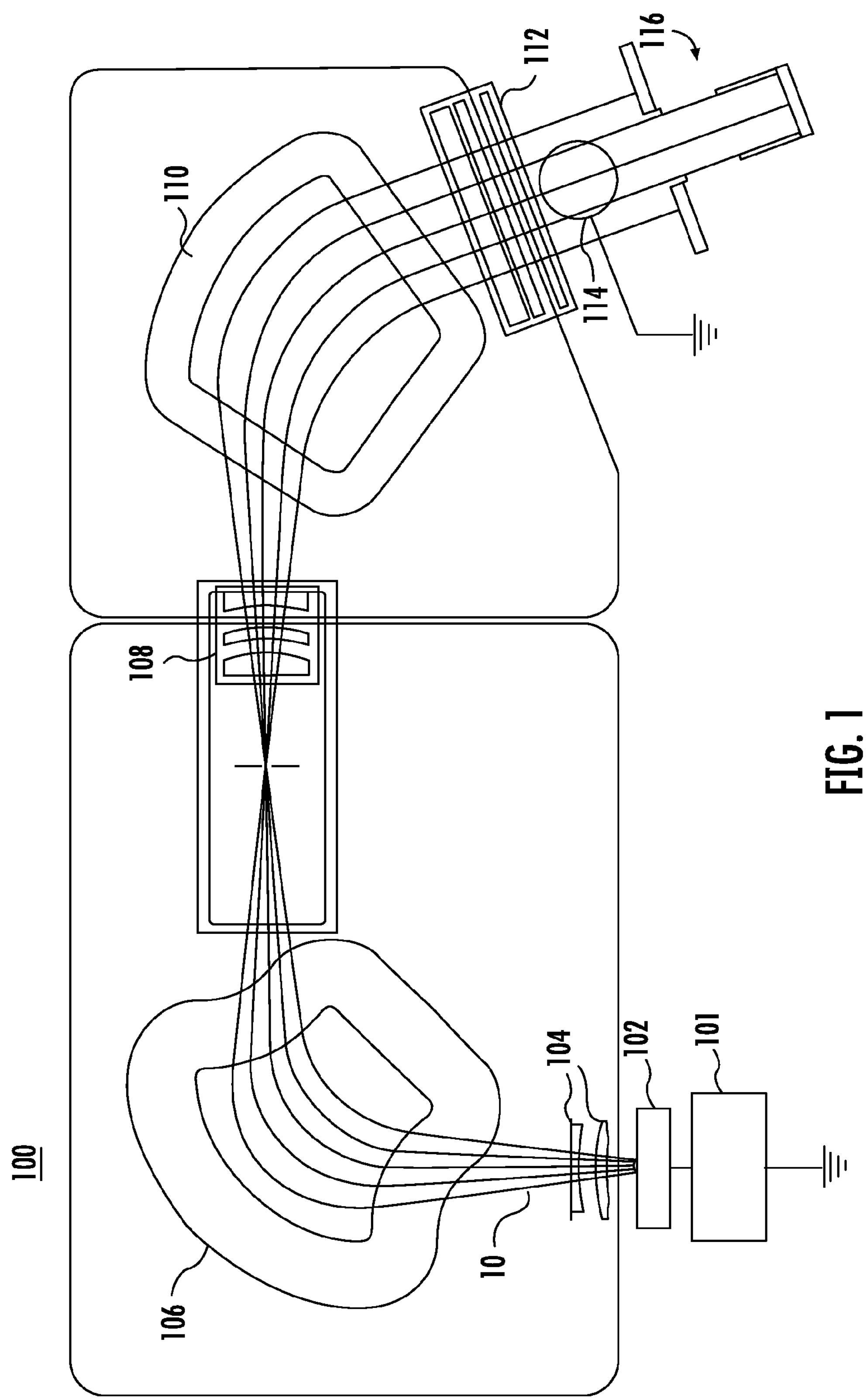
FIG. 1 is a schematic illustration of an exemplary ion implant system.
Figure 2:
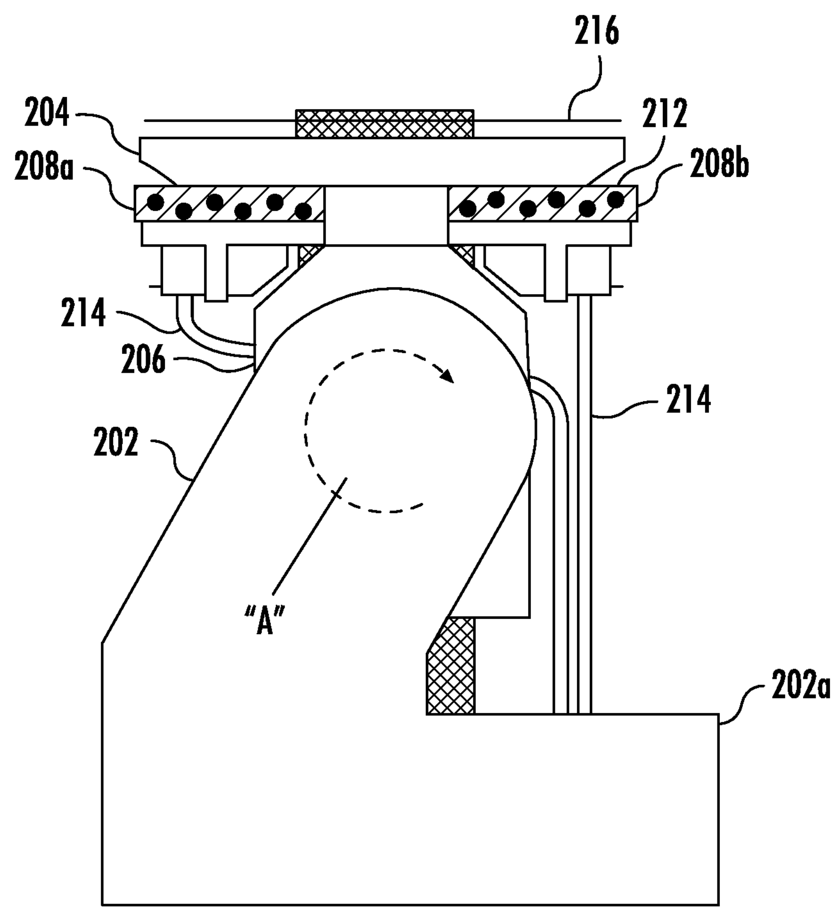
FIG. 2 is a side view of an exemplary rotating platen system.
Figure 3:
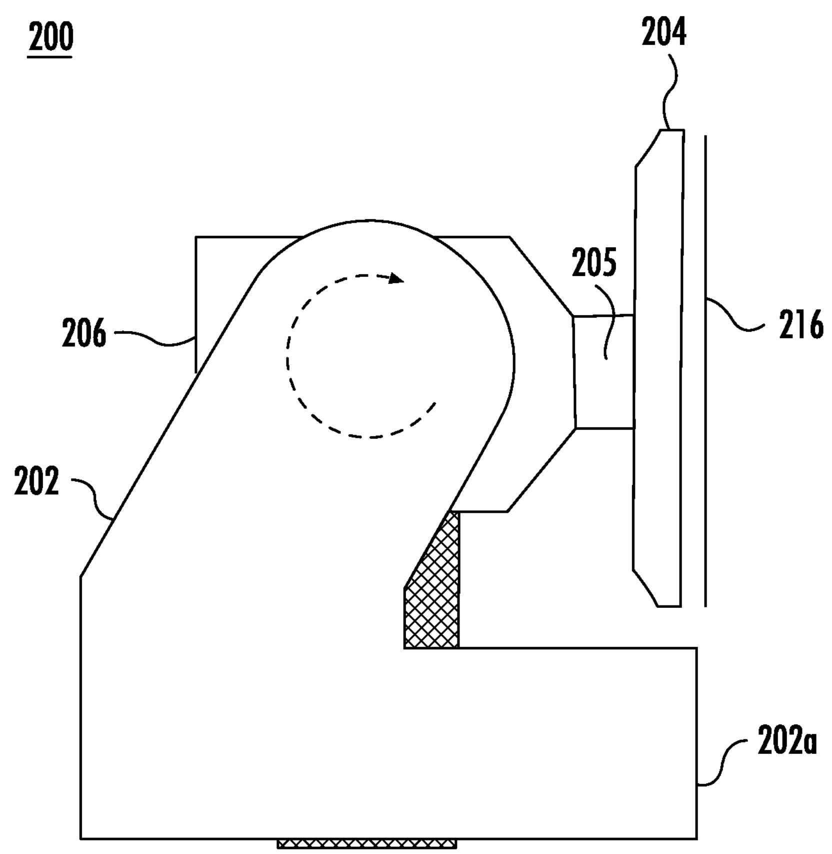
FIG. 3 is a side view of the rotating platen system of FIG. 2, in a rotated position.

Referring to FIG. 2, an exemplary apparatus 200 is shown for cooling a platen. FIG. 2 shows a rotating platen apparatus 202 having a base 202*a*, a platen 204, and a motor 206 connected to the platen 204. In this example, thermal pads 208*a*, 208*b* are provided beneath the platen 204. The thermal pads 208*a*, 208*b* may include thermal channels 212 through which cryogenic fluid can flow within the thermal pads 208*a*, 208*b*. As cryogenic fluid flows through the thermal pads 208*a*, 208*b*, a wafer 216 disposed on the platen 204 may be cooled to a desired temperature. The thermal channels 212 in the thermal pads 208*a*, 208*b* may connect to one or more supply and drain pipes 214, which, in turn, are connected to a cryogenic fluid source and/or drain (not shown). It will be appreciated that in some embodiments only a single thermal pad will be used. It will also be appreciated that although thermal pads may be used, they are not required. Thus, in some embodiments the thermal channels may be integrated directly into the platen. FIG. 3 depicts another side view of the apparatus 200 in which the actuating arm 205 has been rotated by 90° degrees (i.e., in the direction of arrow "A" in FIG. 2) so that the wafer is oriented in the vertical position. It will be appreciated that the platen may also, or alternatively, provide in-plane rotation the wafer, as desired. It will additionally be appreciated that although the figures show the platen 204 in the horizontal and vertical positions, that the platen 204 may be rotated by any angle desired so as to present the wafer 216 to the ion beam in any desired orientation.

Figure 4:
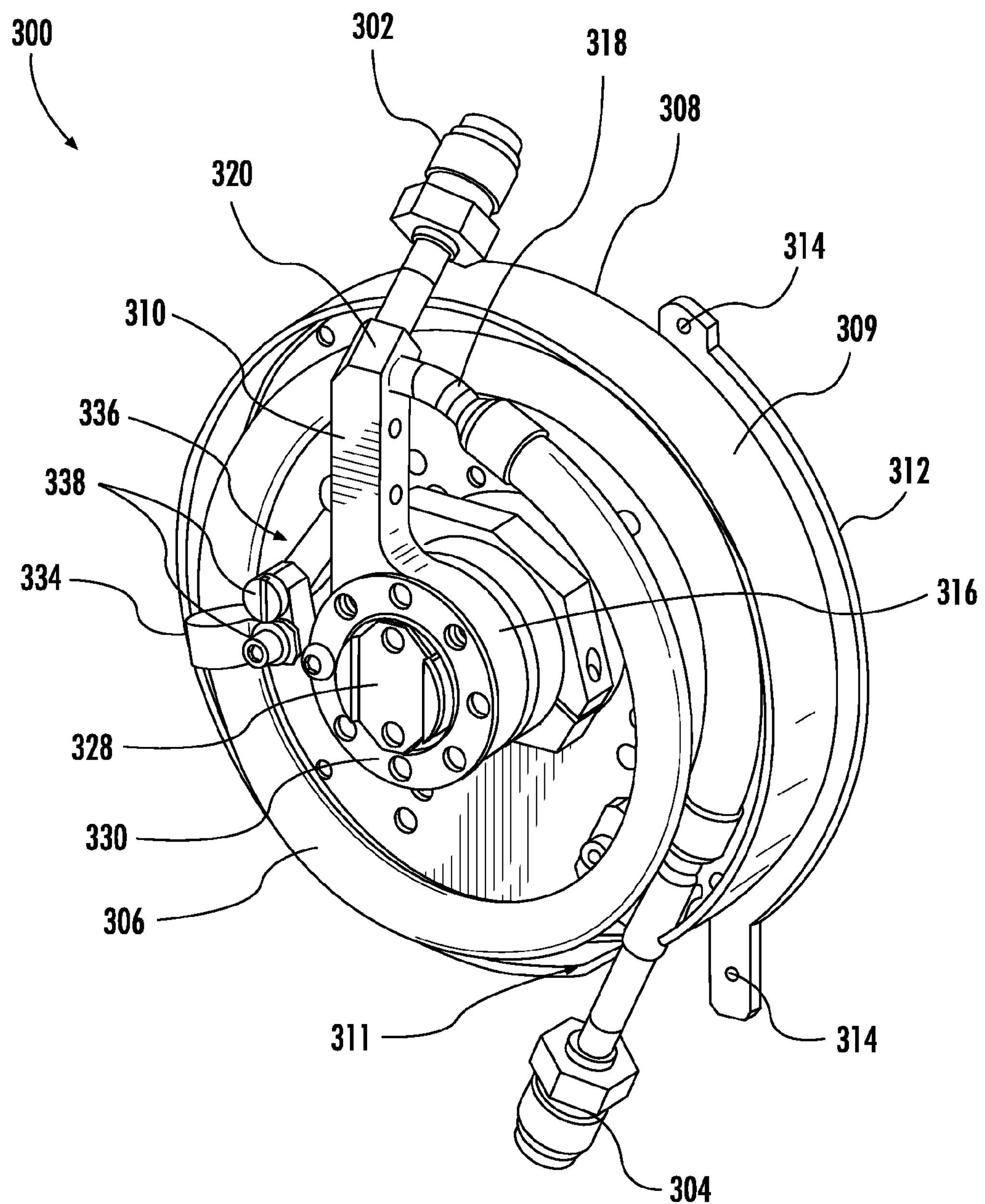
FIG. 4 is an isometric view of the disclosed rotary union.

Referring now to FIG. 4, an exemplary rotary union 300 is disclosed for use in a rotating platen arrangement such as the one described in relation to FIGS. 2 and 3. It will be appreciated that the disclosed rotary union 300 may be used in any of a variety of cryogenic applications in which rotary motion is required, and thus it is not limited to use with the platen arrangement of FIGS. 2 and 3.

The rotary union 300 may include first and second tube couplings 302, 304 and a coiled tube portion 306. A drive block portion 310 may be disposed between the coiled tube portion 306 and the first tube coupling 302. The union may also include a base portion 308 for connecting the union to an appropriate rotating platen apparatus. The base portion 308 may have a flange portion 312 including one or more openings or recesses 314 to receive suitable fasteners for connecting the rotary union 300 to the rotating platen apparatus 200 (FIG. 2). The base portion 308 may further include a cylindrical wall portion 309 disposed about a periphery of the base. This cylindrical wall portion 309 may serve to confine the coiled tube portion 306 to a maximum outer diameter during operation. Such confinement may ensure that the coiled tube portion 306 flexes within a controlled range as the rotary union rotates, thus preventing undesired movement of the tubing which can cause deleterious rubbing of the components in use. Such rubbing may undesirably generate particles, and can result in premature failure of the tubing. One or more openings 311 in the cylindrical wall portion 309 may be provided to allow the second tube coupling 304 to protrude therethrough.

The first and second tube couplings 302, 304 may be connected to cryogenic supply and drain pipes 214 of the apparatus 200 so that cryogenic fluid may be supplied from the cryogenic fluid supply, through the pipes 214 and rotary union 300, then through the thermal channels 212 in the thermal pads 208*a, b* (or the platen itself if thermal pads are not used). A similar return path may be provided via a separate rotary union 300, as will be described in greater detail later.

In some embodiments, the drive block portion 310 and the first tube coupling 302 may be rotatable in relation to the base 202*a* of the rotating platen assembly 200 while the second tube coupling 304 may be fixed in relation to the rotating platen 204 (see FIG. 3). In other embodiments, the second tube coupling 304 may be fixed in relation to the base 202*a* of the rotating platen assembly 200 while the drive block portion 310 and first tube coupling 302 may be fixed in relation to the rotating platen 204. Regardless of the specific arrangement, when the platen 204 rotates with respect to the base 202*a*, the first and second tube couplings 302, 304 may rotate with respect to each other, and the coiled tubing portion 306 may flex to accommodate the rotation.

Figure 11:
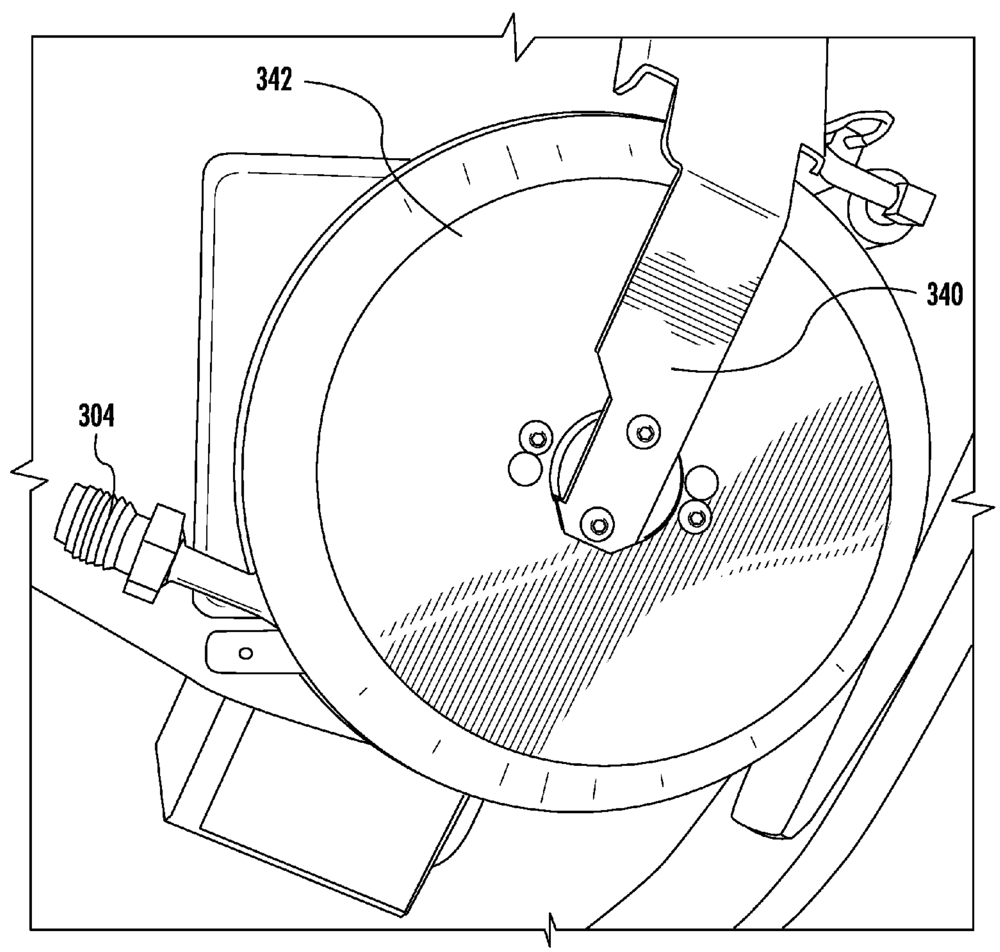
FIG. 11 is a side view of the rotary union of FIG. 8 including a cover plate.

Referring to FIGS. 4-7, the drive block portion 310 may include a stem engaging portion 316, a coupling portion 318 for connecting to the coiled tube portion 306, and a tube coupling portion 320 for connecting to the first tube coupling 302. Although not shown, the drive block portion 310 may also include an internal fluid channel to allow cryogenic fluid to flow between the coiled tube portion 306 and the first tube coupling 302. As can be seen more clearly in FIGS. 6 and 7, the stem engaging portion 316 may connect to a stem 322 which in turn is connected to the base portion 308 via a bushing 332. This arrangement enables the stem 322 to rotate with respect to the base portion 308. A disk member 324 may be positioned between the stem engaging portion 316 and the stem 322. The disk member 324 comprises a thermal insulation material to minimize the low temperature in the coiled tube portion 306 from cooling the rest of the assembly by an undesirable amount. The stem engaging portion 316 may be fixed to the stem 322 by a plurality of fasteners 326. Central and peripheral cover insulator members 328, 330 may be provided over the stem engaging portion 316. Cover insulator member 330 may comprise an insulator material to prevent undesired cooling of a cover 342 (FIG. 11). The central cover insulator member 328 may include a channel 329 for receiving a guard bracket 340 (FIG. 9), as will be described in greater detail later.

Figure 5:
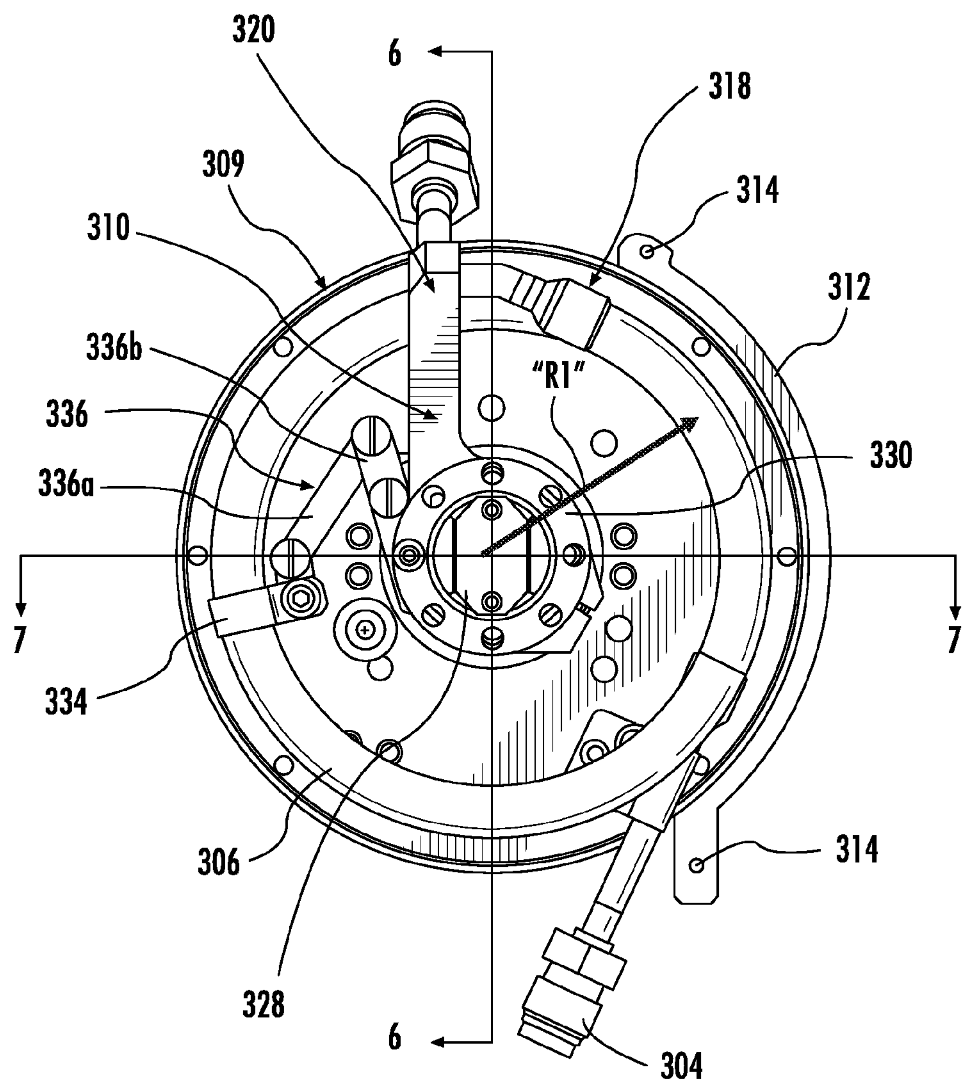
FIG. 5 is a front view of the rotary union of FIG. 4.
Figure 6:
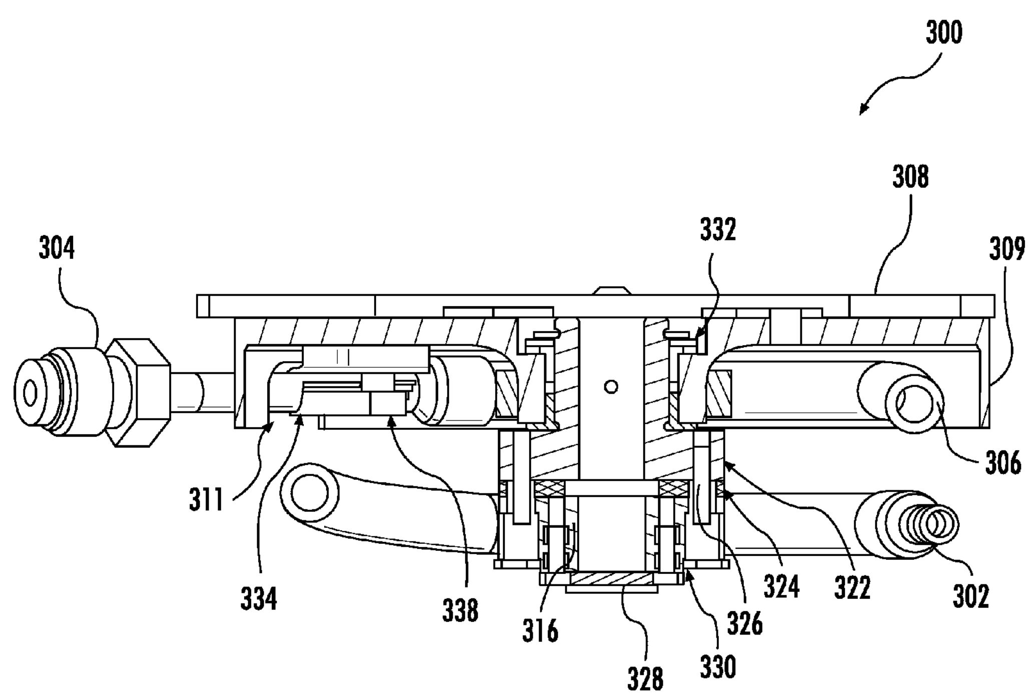
FIG. 6 is a cross-section of the rotary union of FIG. 4 taken along line 6-6 of FIG. 5.
Figure 7:
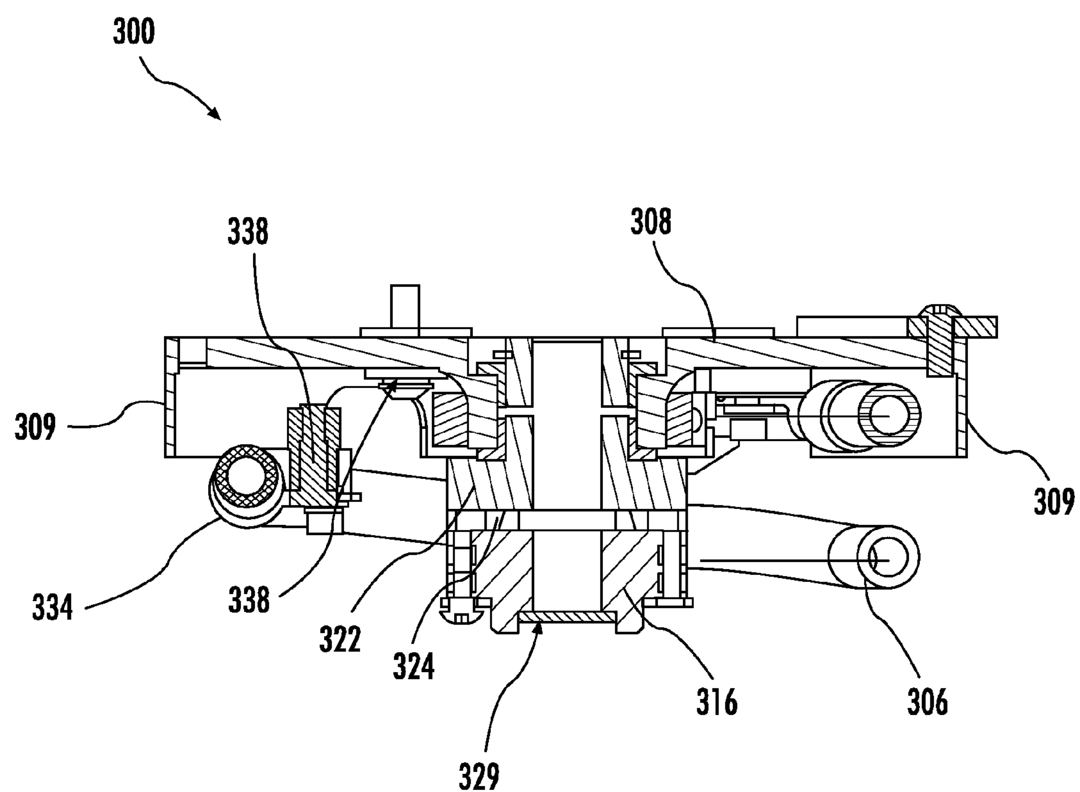
FIG. 7 is a cross-section of the rotary union of FIG. 4 taken along line 7-7 of FIG. 4.

FIG. 5 shows the coiled tube portion 306 in a relaxed configuration, which corresponds to a configuration in which the rotary union 300 is not actuated. In this non-actuated position, the tube portion has a first bend radius "R1." When the rotary union 300 is rotated (actuated) such as when the platen 204 is rotated with respect to the base 202*a* of the rotary platen apparatus (a configuration shown in FIG. 10), the coiled tube portion 306 assumes a compressed or flexed configuration such that it assumes a second bend radius "R2," which is smaller than the first bend radius. It will be appreciated that although the illustrated embodiment is shown in these two positions, the rotary union 200 may cycle through any of a variety of positions during operation of the rotating platen apparatus 202 (FIG. 2). Thus, in some instances, the rotary union may only be required to rotate a few degrees, while in other embodiments the rotary union may be required to rotate up to, or in excess of 90 degrees.

To prevent unfettered movement of the coiled tube portion 306 during operation, a restraining arrangement may be coupled to the coiled tube portion to restrict its movement somewhat during operation. In one non-limiting exemplary embodiment, a tube clamp 334 may connect to the coiled tube portion to the base portion 308 or other fixed portion of the rotary union. In the illustrated embodiment, the tube clamp 334 is coupled to a two-bar linkage 336 which, in turn, is coupled to base portion 308. The two-bar linkage 336 may include first and second link members 336*a*, 336*b*, that are rotatable with respect to each other. The link members may be connected to each other, and to the tube clamp 334 and base portion 308 via suitable fasteners 338, such as screws so that the link members and tube clamp can rotate to a limited extent with respect to each other.

Figure 8:
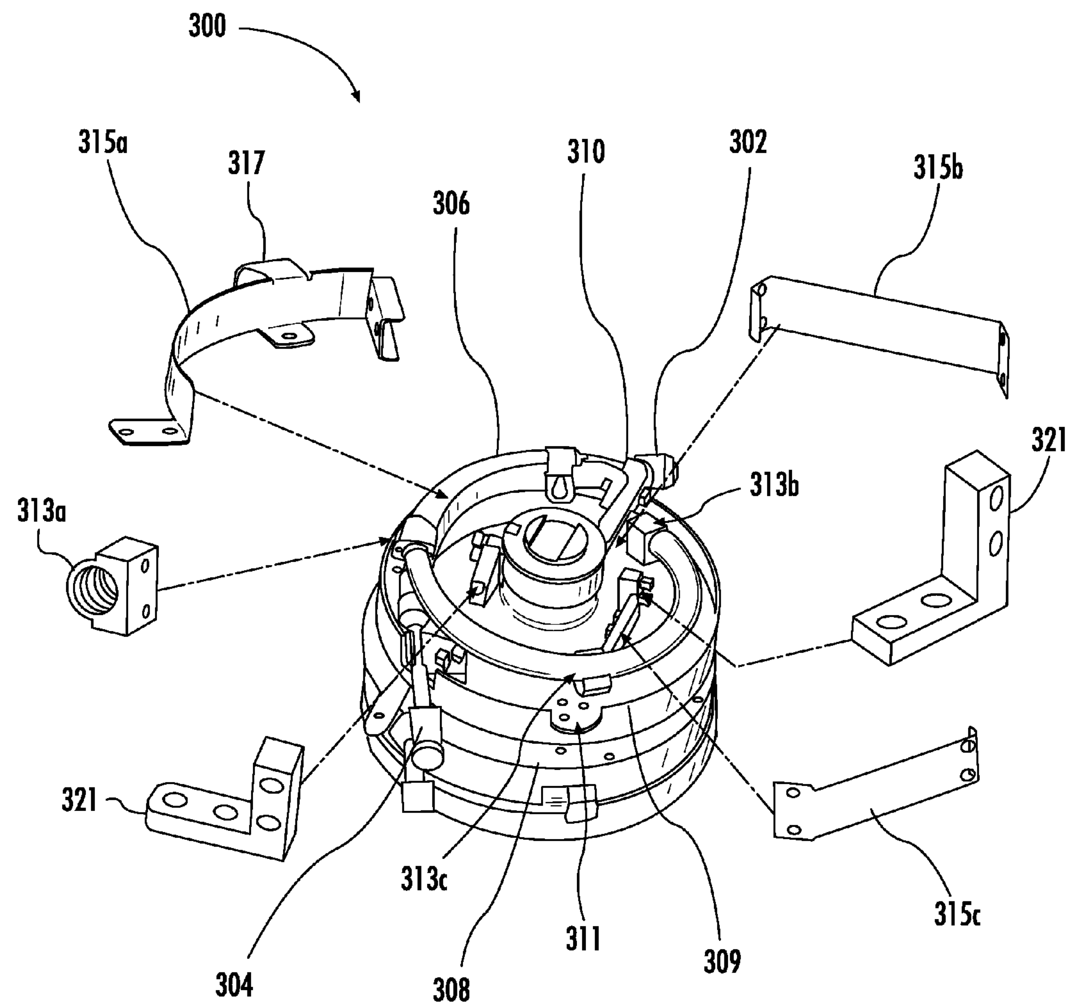
FIG. 8 is a partially exploded isometric view of an alternative embodiment of the disclosed rotary union.

The illustrated linkage 336 is but one way to provide the coiled tube portion 306 with limited freedom to move during operation so as to take maximum advantage of its flexible coiling/uncoiling characteristics. As will be appreciated, this arrangement is not exclusive, and other arrangements can also be used to limit movement of the coiled tube portion 306 in operation. For example, as shown in FIG. 8, an alternative restraint arrangement is illustrated. Similar to the embodiment of FIG. 4, the rotary union 300 of the FIG. 8 embodiment may include first and second tube couplings 302, 304, a coiled tube portion 306, a drive block portion 310, and a base portion 308 having a cylindrical wall portion 309. One or more openings 311 in the cylindrical wall portion 309 may be provided to allow the second tube coupling 304 to protrude therethrough.

The tube restraint of this embodiment, however, does not use a two-bar linkage. Rather, the coiled tube portion 306 may be coupled to the base portion 308 via a plurality of tube clamps 313*a-c* disposed along the length of the tube portion. Each of the tube clamps 313*a-c*, in turn, may be coupled to an end of a flexible support member 315*a-c*, which in one embodiment is a thin stainless steel sheet member. One of the flexible support members 315*a* is coupled at an opposite end to the drive block portion 310. The flexible support member 315*a* has an additional tube coupling flange 317 disposed at a mid-portion of the member. The other flexible support members 315*b* and 315*c* are coupled at an opposite end to a vertical leg of respective L-shaped support brackets 321. The horizontal leg of each L-shaped support bracket is then coupled to the base portion 308.

Thus arranged, as the coiled tube portion 306 coils and uncoils during operation, the flexible support members 315*a-c* allow the tube portion 306 to flex, while also guiding the tube portion back and forth along a desired path. As previously noted, this arrangement minimizes the chance that pieces will rub together, increasing the working life of the assembly.

The coiled tube portion 306 may be any appropriate flexible tubing designed for operation at cryogenic temperatures. In one non-limiting exemplary embodiment, the coiled tube portion 306 is a hydroformed stainless steel flex tubing. It will be appreciated that other types of flexible tubing, such as welded or mechanically formed tubing, can also be used. The first and second tube couplings 302, 304 may be appropriate o-ring fittings or compression fittings that are welded, brazed or otherwise connected to the drive block portion 310 and the coiled tube portion 306, respectively.

As will be appreciated, by arranging the tubing in a spiral (coiled) pattern, the tube 306 can coil and uncoil for many cycles without degradation, even though tubing is manufactured to operate in a substantially linear fashion or with limited bending. The inventor has discovered that by enclosing the tube 306 in a cylindrical housing (consisting of the vertical walls 309 of the base portion 308), the tubing can be made to coil tighter than expected, and that a cryogenic fluid can flow through the tube while the ends of the tubing are rotated up to 115 degrees in the illustrated embodiment. In one non-limiting exemplary embodiment, the coiled tube portion 306 can assume as little as a 4-inch bend radius when using ¼-inch ID flexible tubing. It will be appreciated that additional rotational freedom (greater than 360-degrees) may be achieved by increasing the length of the coiled tube portion 306.

Figure 9:
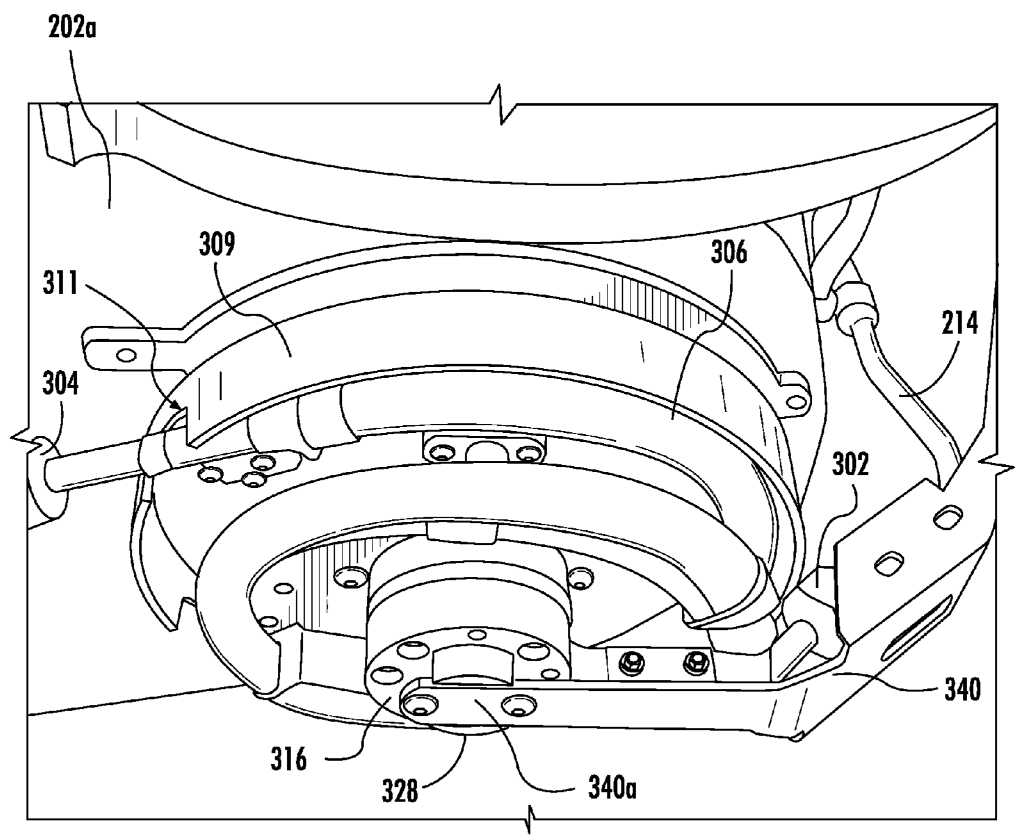
FIG. 9 is an isometric view of the rotary union of FIG. 8 in an unrotated position.

FIG. 9 shows the rotary union 300 connected to the base 202*a* of the rotary platen apparatus 200 of FIG. 2. In the illustrated embodiment, a guard member 340 is positioned over the first tube coupling 302 and the drive block portion 310. A first end 340*a* (FIG. 9) of the guard member 340 is received at one end within the groove 329 (FIG. 7) of the central cover insulator member 328. A second end 340*b* (FIG. 10) of the guard member 340 is connected to the platen 304 or other structure that rotates with the platen. This guard member 340 may accommodate the rotational force applied to the union 300 during rotation of the platen 304, thus minimizing stress on the first tube coupling 302 and drive block portion 310. As arranged, when the platen 204 and base 202*a* rotate with respect to each other, rotational forces are applied through the guard member 340 directly to the stem 322, which can rotate with respect to the base portion 308.

Figure 10:
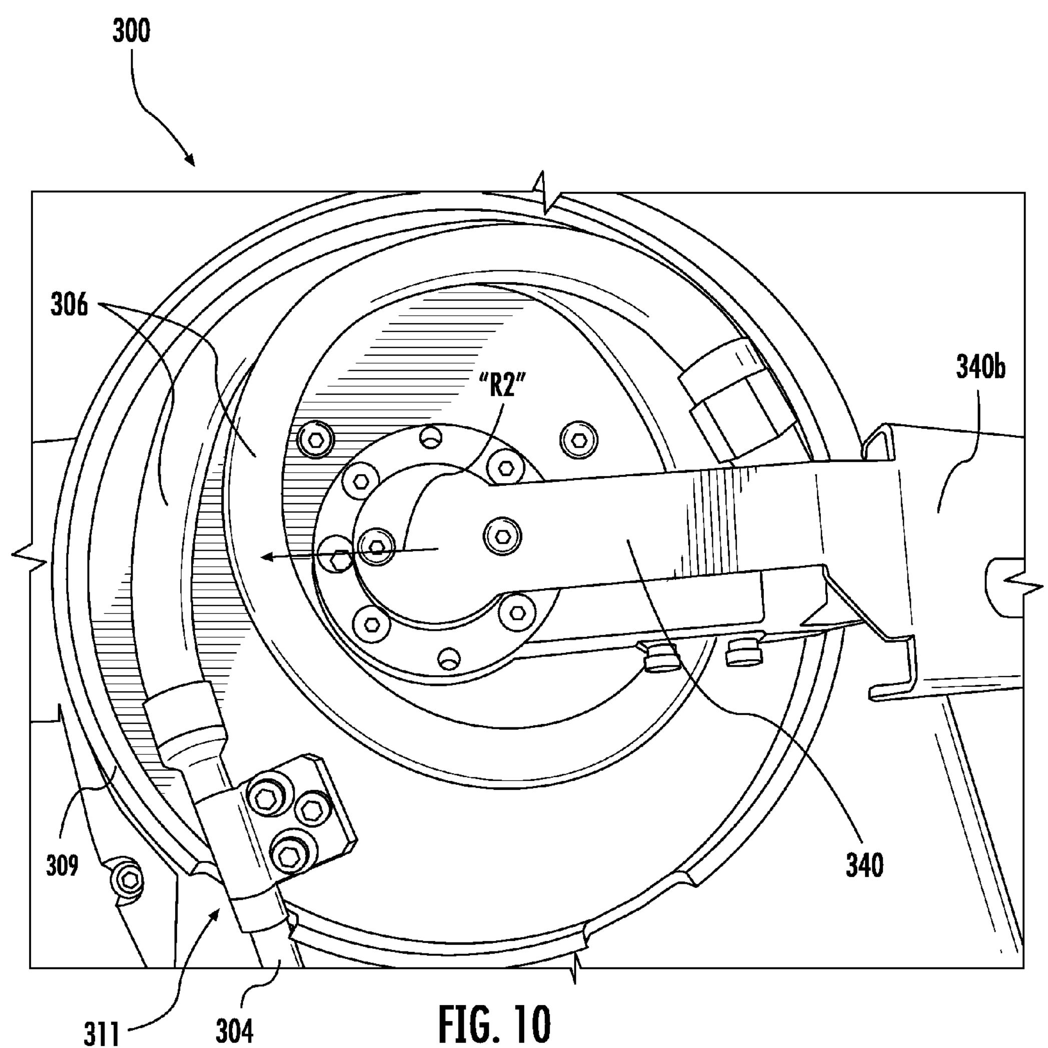
FIG. 10 is a side view of the rotary union of FIG. 8 in a rotated position.

FIG. 10 shows the rotary union 300 in a configuration in the "actuated" position, in which the second tube coupling 304 has been rotated by about 90-degrees in the counter-clockwise direction as compared to the non-actuated configuration illustrated in FIGS. 4-8. As can be seen, in this configuration, the inner loop of the coiled tube portion 306 has assumed a smaller bend radius ("R2") to accommodate the rotation of the union. Upon return of the platen 204 to its original, unrotated, position with respect to the base 202*a*, the coiled tube portion 306 will flex back outward to assume its original bend radius ("R1") (see FIG. 5).

FIG. 11 shows the rotary union 300 of FIG. 10 with a protective cover 342 installed to enclose the internal components of the union. The protective cover 342 may act in combination with the base portion 308 and the vertical walls 309 to confine movement of the coiled tube portion 306 as the tube flexes during rotation of the union 300. As previously noted, such confinement serves to ensure that the coiled tube portion 306 flexes within a controlled range, thus preventing undesired movement of the tubing which can cause deleterious rubbing of the components in use. The protective cover 342 provides physical protection for the coiled tube portion 308, prevents direct or indirect ion beam strikes of the rotary union components, contain any particles generated during movement of tube, bearing/bushings, or flexures, and prevent photo-resist from condensing on the coiled tube portion during ion implant processes.

Figure 12:
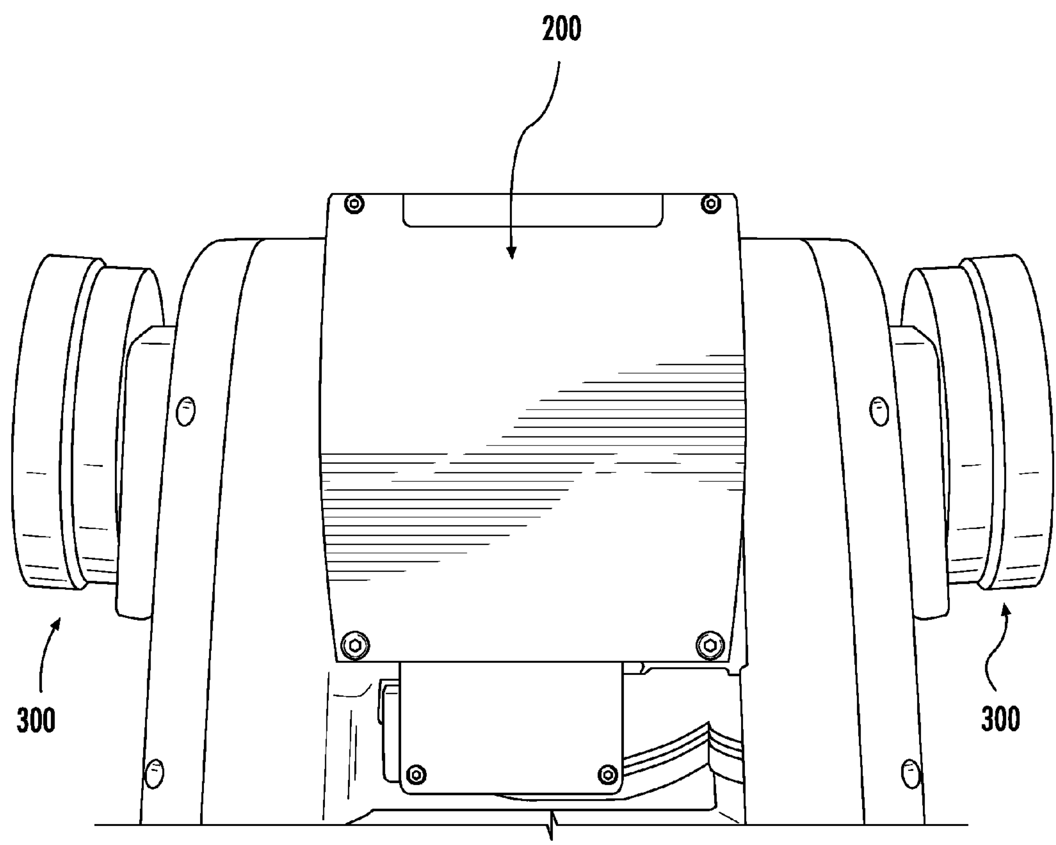
FIG. 12 is an end view of a portion of a rotating platen system incorporating two of the rotary unions of FIG. 8.

FIG. 12 shows an application in which a pair of rotary unions 300 are used with the apparatus 200 of FIGS. 2-3. In this embodiment, one of the rotary unions 300 supports the supply of cryogenic fluid from the chiller to the cooling platen, while the other rotary union 300 supports the drainage of cryogenic fluid back to the chiller.

As described, the disclosed rotary union 300 restricts the coiled tube portion 306 so that it may only move in a coiled manner. Any lateral movement is constrained by the flexures, thereby maintaining the proscribed coiling/uncoiling motion. Additionally, during operation, the coiled tube portion 306 is under pressures as high as 150 psi, and is susceptible to distortion of the coiling/uncoiling movement desired for long term operation. Without such constraint, the coiled tube portion can "squirm" causing unwanted rubbing of components and undesired generation of particles.

As will be appreciated, the disclosed rotary union 300 allows the platen 204 to be moved from a load position (flat—FIG. 2) to an implant position (FIG. 3, for example) while facilitating the flow of cold gas to the platen or to a cooling ring behind the platen.

It should be appreciated that embodiments of the present disclosure may apply to any of a variety of ion implantation systems, such as plasma-based ion implantation systems. These may include radio frequency plasma doping (RF-PLAD) systems, glow discharge plasma doping (GD-PLAD) systems, and other similar systems.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. While the invention has been disclosed with reference to certain embodiments, numerous modifications, alterations and changes to the described embodiments are possible without departing from the spirit and scope of the invention, as defined in the appended claims. Accordingly, it is intended that the present invention not be limited to the described embodiments, but that it has the full scope defined by the language of the following claims, and equivalents thereof.

What is claimed is:

1. A rotary platen apparatus, comprising:

a platen base;

a platen rotatably coupled to the platen base;

a coiled flexible tube member coupled between the platen base and the platen, the coiled flexible tube member for supplying fluid to the platen, the coiled flexible tube member having a first configuration associated with a non-rotated position of the platen and a second configuration associated with a rotated position of the platen;

a base portion having a peripheral outer wall for controllably restraining movement of the coiled flexible tube member as the coiled flexible tube member moves between the first configuration and the second configuration; and a drive block portion fixed to one of the platen base and the platen, the drive block portion coupled to one end of the coiled tube portion, the drive block portion having an internal fluid channel to receive fluid from, or provide fluid to, the coiled tube portion;

wherein in the first configuration the coiled flexible tube member has a first bend radius, and in the second configuration the coiled flexible tube member has a second bend radius, the first and second bend radii being different.

2. The rotary platen apparatus of claim 1, wherein the second bend radius is smaller than the first bend radius.

3. The rotary platen apparatus of claim 1, further comprising first and second tube couplings associated with first and second ends of the coiled flexible tube member, the first tube coupling for receiving cryogenic fluid from a cryogenic fluid source, the second tube coupling for supplying cryogenic fluid to the platen.

4. The rotary platen apparatus of claim 1, further comprising a clamp member coupled between the coiled flexible tube member and a base portion of the rotary platen apparatus for controllably restraining movement of the coiled flexible tube member as the coiled flexible tube member moves between the first configuration and the second configuration.

5. The rotary platen apparatus of claim 1, further comprising a base portion having a peripheral outer wall and a cover connected to the base member, wherein the base member, peripheral outer wall and cover are configured for controllably restraining movement of the coiled flexible tube member as the coiled flexible tube member moves between the first configuration and the second configuration.

6. The rotary platen apparatus of claim 1, wherein the fluid comprises a liquid, a gas, or combinations thereof.

7. A rotary flex arrangement for use in semiconductor processing, the rotary flex arrangement comprising:

a base portion;

a coiled flexible tube member having first and second ends, the first end coupled to a drive block portion, the second end coupled to a tube fitting, the drive block portion fixed with respect to one of a platen base and a platen, wherein the coiled flexible tube member has a first configuration associated with a non-rotated position of the platen with respect to the platen base and a second configuration associated with a rotated position of the platen with respect to the platen base;

wherein the base portion further having a peripheral outer wall for controllably restraining movement of the coiled flexible tube member as the coiled flexible tube member moves between the first configuration and the second configuration; and wherein in the first configuration the coiled flexible tube member has a first bend radius, and in the second configuration the coiled flexible tube member has a second bend radius, the first and second bend radii being different.

8. The rotary flex arrangement of claim 7, wherein the second bend radius is smaller than the first bend radius.

9. The rotary flex arrangement of claim 7, the further comprising a first tube coupling for receiving cryogenic fluid from a cryogenic fluid source, and a second tube coupling for supplying cryogenic fluid to the platen.

10. The rotary flex arrangement of claim 7, further comprising a clamp member for controllably restraining movement of the coiled flexible tube member as the coiled flexible tube member moves between the first configuration and the second configuration.

11. The rotary flex arrangement of claim 7, wherein the drive block portion has an internal fluid channel to receive fluid from, or provide fluid to, the coiled tube portion.

12. The rotary flex arrangement of claim 7, wherein the base portion has a peripheral outer wall and a cover connected to the base portion, and wherein the base portion, peripheral outer wall and cover are configured to controllably restrain movement of the coiled flexible tube member as the coiled flexible tube member moves between the first configuration and the second configuration.

13. The rotary flex arrangement of claim 7, wherein the fluid comprises a liquid, a gas, or combinations thereof.

14. A rotary platen apparatus, comprising:

a platen base having a platen rotatably coupled thereto;

a coiled flexible tube member for supplying fluid from a fluid source to the platen, the coiled flexible tube member coupled between the platen base and the platen, the coiled flexible tube member having a first configuration associated with a non-rotated position of the platen and a second configuration associated with a rotated position of the platen;

a base portion having a peripheral outer wall for controllably restraining movement of the coiled flexible tube member as the coiled flexible tube member moves between the first configuration and the second configuration; and a drive block portion fixed with respect to one of the platen base and the platen, the drive block portion coupled to one end of the coiled flexible tube member, the drive block portion having an internal fluid channel to receive fluid from, or provide fluid to, the coiled tube portion;

wherein in the first configuration the coiled flexible tube member has a first bend radius, and in the second configuration the coiled flexible tube member has a second bend radius that is smaller than the first radius.

15. The rotary platen apparatus of claim 14, wherein the coiled flexible tube member comprises hydroformed stainless steel flexible tubing.

16. The rotary platen apparatus of claim 14, wherein the base portion has a peripheral outer wall and a cover connected to the base portion, and wherein the base portion, peripheral outer wall and cover are configured to controllably restrain movement of the coiled flexible tube member as the coiled flexible tube member moves between the first configuration and the second configuration.

17. The rotary platen apparatus of claim 14, wherein the fluid comprises a liquid, a gas, or combinations thereof.

* * * * *